(12) United States Patent
Gombarick, Jr. et al.

(10) Patent No.: US 8,943,766 B2
(45) Date of Patent: Feb. 3, 2015

(54) PHOTOVOLTAIC ROOFING ELEMENTS, PHOTOVOLTAIC ROOFING SYSTEMS, METHODS AND KITS

(75) Inventors: Joseph C. Gombarick, Jr., Phoenixville, PA (US); Robert L. Jenkins, Honeybrook, PA (US)

(73) Assignee: CertainTeed Corporation, Valley Forge, PA (US)

( * ) Notice: Subject to any disclaimer, the term of this patent is extended or adjusted under 35 U.S.C. 154(b) by 0 days.

(21) Appl. No.: 13/598,082

(22) Filed: Aug. 29, 2012

(65) Prior Publication Data
US 2013/0055664 A1    Mar. 7, 2013

Related U.S. Application Data

(60) Provisional application No. 61/528,607, filed on Aug. 29, 2011.

(51) Int. Cl.
*E04D 13/18*      (2014.01)
*H01L 31/048*     (2014.01)
*H01L 31/0392*    (2006.01)

(52) U.S. Cl.
CPC ...... *H01L 31/0482* (2013.01); *H01L 31/03926* (2013.01); *Y02E 10/50* (2013.01); *Y02B 10/12* (2013.01)
USPC ...................................................... 52/173.3

(58) Field of Classification Search
CPC ....... E04D 1/26; E04D 1/20; E04D 2001/005; E04D 2001/3458; E04D 5/12; E04D 13/00; H01L 31/0482; H01L 31/0483; H01L 31/042; Y02E 10/50; Y02E 10/47
USPC ............................................. 52/173.1, 173.3
See application file for complete search history.

(56) References Cited

U.S. PATENT DOCUMENTS

| | | | |
|---|---|---|---|
| 1,975,986 A | | 10/1934 | Straub |
| 2,253,753 A | * | 8/1941 | Black ............................. 52/545 |
| 4,226,069 A | | 10/1980 | Hinds |
| 4,636,579 A | * | 1/1987 | Hanak et al. .................. 136/245 |
| 4,672,790 A | * | 6/1987 | Freiborg ......................... 52/521 |
| 5,707,459 A | * | 1/1998 | Itoyama et al. ............... 136/251 |
| 6,758,019 B2 | * | 7/2004 | Kalkanoglu et al. ............ 52/553 |
| 2006/0201094 A1 | | 9/2006 | Lassiter |
| 2007/0266562 A1 | * | 11/2007 | Friedman et al. ............ 29/897.3 |
| 2008/0006323 A1 | * | 1/2008 | Kalkanoglu et al. .......... 136/253 |
| 2008/0271773 A1 | * | 11/2008 | Jacobs et al. .................. 136/244 |
| 2008/0271774 A1 | * | 11/2008 | Kalkanoglu et al. .......... 136/244 |
| 2009/0000221 A1 | * | 1/2009 | Jacobs et al. .................. 52/173.3 |
| 2009/0000222 A1 | * | 1/2009 | Kalkanoglu et al. ......... 52/173.3 |

(Continued)

*Primary Examiner* — Elizabeth A Plummer
(74) *Attorney, Agent, or Firm* — McDonnell Boehnen Hulbert & Berghoff LLP (57) ABSTRACT

In one aspect, the invention provides a photovoltaic roofing element for disposal on a roof deck. The photovoltaic roofing element includes a roofing substrate including a top end and a bottom end. The roofing substrate includes an upward-facing zone having an upward-facing surface and a bottom end; a lateral flexible zone extending adjacent the bottom end of the upward-facing zone, the lateral flexible zone having a bottom end; and a strip of material disposed at the bottom end of the lateral flexible zone having a first surface on the same side of the substrate as the upward-facing surface and a height of at least about 1 cm as measured along a line from the top end to the bottom end of the roofing substrate; and a photovoltaic element disposed on the upward-facing surface of the upward facing zone of the roofing substrate.

19 Claims, 7 Drawing Sheets

(56) References Cited

U.S. PATENT DOCUMENTS

| | | | |
|---|---|---|---|
| 2009/0133340 A1* | 5/2009 | Shiao et al. ............... 52/173.3 |
| 2009/0133738 A1* | 5/2009 | Shiao et al. ............... 136/251 |
| 2009/0133739 A1* | 5/2009 | Shiao et al. ............... 136/251 |
| 2009/0133740 A1* | 5/2009 | Shiao et al. ............... 136/251 |
| 2009/0159118 A1* | 6/2009 | Kalkanoglu et al. ...... 136/251 |
| 2009/0178350 A1* | 7/2009 | Kalkanoglu et al. ...... 52/173.3 |
| 2009/0320898 A1* | 12/2009 | Gumm ......................... 136/245 |
| 2010/0051084 A1* | 3/2010 | Nocito et al. .............. 136/244 |
| 2010/0146878 A1* | 6/2010 | Koch et al. ................. 52/173.3 |
| 2010/0180523 A1* | 7/2010 | Lena et al. .................. 52/173.3 |
| 2010/0282318 A1* | 11/2010 | Kalkanoglu et al. ...... 136/259 |
| 2011/0017278 A1* | 1/2011 | Kalkanoglu et al. ...... 136/251 |
| 2011/0030761 A1* | 2/2011 | Kalkanoglu et al. ...... 136/245 |

* cited by examiner

PHOTOVOLTAIC ROOFING ELEMENTS, PHOTOVOLTAIC ROOFING SYSTEMS, METHODS AND KITS

CROSS-REFERENCE TO RELATED APPLICATIONS

The present application claims priority to U.S. Provisional Patent Application Ser. No. 61/528,607, filed Aug. 29, 2011, which is hereby incorporated herein by reference in its entirety.

BACKGROUND OF THE INVENTION

1. Field of the Invention

The present invention relates generally to the photovoltaic generation of electrical energy. The present invention relates more particularly to photovoltaic roofing products for use in photovoltaically generating electrical energy.

2. Technical Background

The search for alternative sources of energy has been motivated by at least two factors. First, fossil fuels have become increasingly expensive due to increasing scarcity and unrest in areas rich in petroleum deposits. Second, there exists overwhelming concern about the effects of the combustion of fossil fuels on the environment due to factors such as air pollution (from $NO_x$, hydrocarbons and ozone) and global warming (from $CO_2$). In recent years, research and development attention has focused on harvesting energy from natural environmental sources such as wind, flowing water, and the sun. Of the three, the sun appears to be the most widely useful energy source across the continental United States; most locales get enough sunshine to make solar energy feasible.

Accordingly, there are now available components that convert light energy into electrical energy. Such "photovoltaic cells" are often made from semiconductor-type materials such as doped silicon in either single crystalline, polycrystalline, or amorphous form. The use of photovoltaic cells on roofs is becoming increasingly common, especially as system performance has improved. They can be used, for example, to provide at least a significant fraction of the electrical energy needed for a building's overall function; or they can be used to power one or more particular devices, such as exterior lighting systems and well pumps.

Accordingly, research and development attention has turned toward integrating photovoltaic cells with roofing products such as shingles, shakes or tiles. A plurality of photovoltaic roofing elements (i.e., including photovoltaic media integrated with a roofing product) can be installed together on a roof, and electrically interconnected to form a photovoltaic roofing system that provides both environmental protection and photovoltaic power generation.

Roofing products equipped with photovoltaic media often have sensitive electrical components disposed on their downward-facing sides, such that the electrical components are protected from moisture. However, especially when the photovoltaic media are somewhat rigid, strong wind can lift up a conventionally-installed photovoltaic roofing element, such that rain can be blown underneath. Similarly, roofing products equipped with photovoltaic media often require electrical connectors to be attached to the products to allow electricity to be collected from photovoltaic cells and delivered to an electrical system. Such connectors can be, for example, mated connectors for connecting adjacent photovoltaic roofing elements, cables for connecting photovoltaic elements to the mated connectors, and/or junction boxes for interconnections within a single photovoltaic roofing element. The interface between such connectors can be susceptible to ingress of moisture. Even when the mated connectors are covered by overlying roofing elements, wind-driven moisture can work its way up the roof underneath the overlying roofing elements and into the connection.

There remains a need for photovoltaic roofing products that address one or more of these deficiencies.

SUMMARY OF THE INVENTION

One aspect of the invention is a photovoltaic roofing element for disposal on a roof deck. The photovoltaic roofing element includes a roofing substrate including a top end configured to be disposed toward the top end of a roof deck, and a bottom end configured to be disposed toward the bottom end of the roof deck, the roofing substrate including an upward-facing zone having an upward-facing surface and a bottom end; a lateral flexible zone extending adjacent the bottom end of the upward-facing zone, the lateral flexible zone having a bottom end; and a strip of material disposed at the bottom end of the lateral flexible zone having a first surface on the same side of the substrate as the upward-facing surface and a height of at least about 1 cm as measured along a line from the top end to the bottom end of the roofing substrate; and a photovoltaic element disposed on the upward-facing surface of the upward facing zone of the roofing substrate.

BRIEF DESCRIPTION OF THE DRAWINGS

The accompanying drawings are not necessarily to scale, and sizes of various elements can be distorted for clarity.

FIG. 1 is schematic top view.

DETAILED DESCRIPTION

Figure 1:
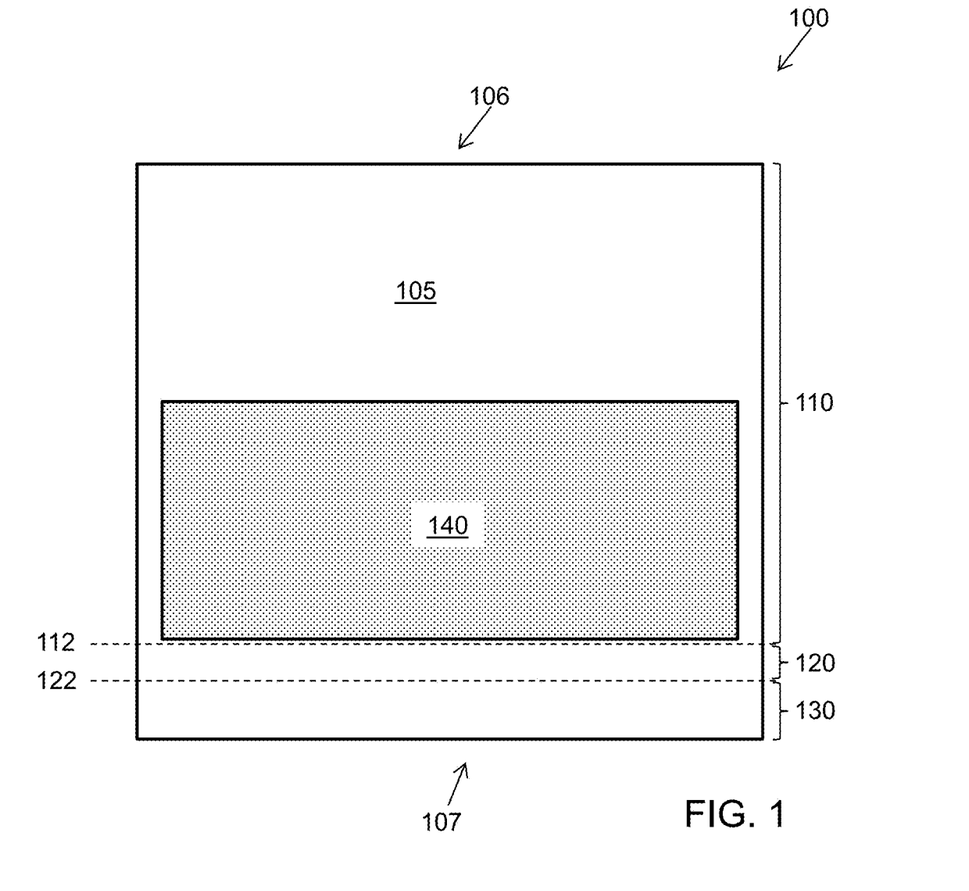
Figure 2:
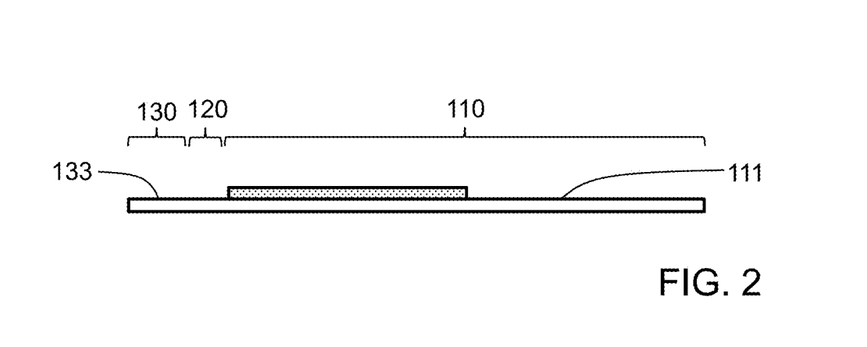
FIG. 2 is a schematic cross-sectional view of a photovoltaic roofing element according to one embodiment of the invention.

One embodiment of a photovoltaic roofing element according to one aspect of the invention is shown in schematic top view in FIG. 1 and in schematic cross-sectional view in FIG. 2. Photovoltaic roofing element 100 includes a roofing substrate 105, which has a top end 106 configured to be disposed toward the top end of the roof deck, and a bottom end 107 configured to be disposed toward the bottom end of the roof deck. The roofing substrate includes an upward-facing zone 110 having an upward-facing surface 111 and a bottom end 112. The upward-facing zone is configured to generally face upward (i.e., toward the sky) when installed on the roof deck. The roofing substrate further includes a lateral flexible zone 120 extending adjacent the bottom end 112 of the upward-facing zone 110. The lateral flexible zone has a bottom end 122. The roofing substrate further includes a strip of material 130 disposed adjacent the bottom end 122 of the lateral flexible zone 120. The strip of material 130 has a first surface 133, on the same side of the substrate as the upward-facing zone 110. The strip of material 130 has a height (i.e., as measured from the direction of the top end 106 of the roofing substrate 100 to the bottom end 107 of the roofing substrate 100) of at least 1 cm. The photovoltaic roofing element further includes a photovoltaic roofing element disposed on the upward-facing surface of the upward facing zone of the roofing substrate.

Figure 3:
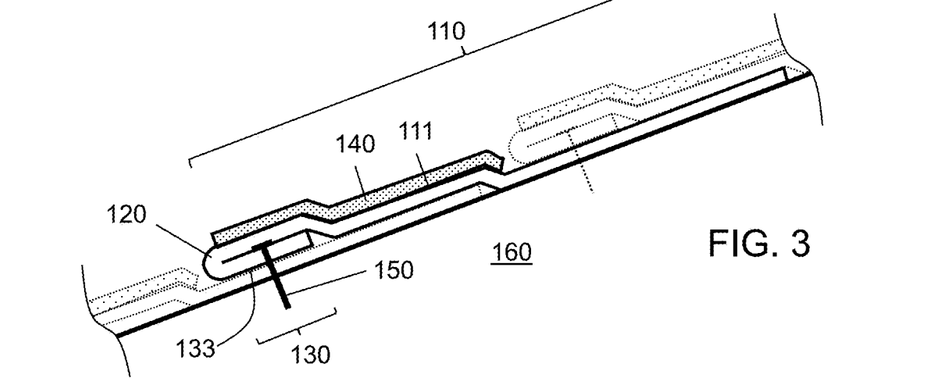
FIG. 3 is a schematic cross-sectional view of the photovoltaic roofing element of FIGS. 1 and 2 installed on a roof deck.

FIG. 3 is a schematic cross-sectional view of the photovoltaic roofing element of FIGS. 1 and 2 installed on a roof deck 160. The person of skill in the art will appreciate that the aspect ratio is distorted in this figure to show the various layers in detail. Two additional photovoltaic roofing elements are shown in phantom view; as the person of skill in the art will appreciate, the photovoltaic roofing elements of the present invention can be disposed in rows or "courses" down the roof in an overlapping manner. Notably, the first surface 133 of the strip of material 130 is disposed facing downward (i.e., toward the roof deck 160). The upward-facing surface 111 is disposed facing upward, so that the photovoltaic element 140 disposed thereon is facing the sky. The flexible zone 120 is bent to fold the strip of material under 130 under the upward facing zone 110. In this embodiment, a fastener 150 (e.g., a nail, a screw, a staple or a rivet) is used to attach the strip of material to the roof deck, by being driven through the strip of material. This configuration can result in a number of advantages. For example, attachment of the bottom end of the photovoltaic roofing element can prevent wind from lifting it up, thereby helping to prevent wind-blown rain from working its way underneath the photovoltaic roofing elements. Accordingly, any electrical components on the underside of the roofing substrate can remain protected. The bent-over flexible zone can also help provide the illusion of thickness and definition of edge detail to a relatively thin roofing substrate, thereby providing an aesthetic benefit. The fastener is also protected from moisture by the folded-over material.

In certain embodiments, the flexible zone can be bent at least 120° without failure (e.g., substantial plastic deformation) to a radius of curvature in the range of about 0.1 mm to about 3 cm. For example, in one embodiment, the flexible zone can be bent at least 120° without failure (e.g., substantial plastic deformation) to a radius of curvature in the range of about 0.1 mm to about 2 cm, or even in the range of about 0.1 mm to about 1 cm. The flexible zone can be made from any suitable flexible material, for example, from polymeric materials or from bituminous materials.

The strip of material disposed at the bottom end of the lateral flexible zone is desirably big enough such that fasteners can be easily driven therethrough. As described above, it can be at least about 1 cm in height as measured along a line from the top end to the bottom end of the roofing substrate. In certain embodiments, it is at least about 2 cm in height, or even at least about 3 cm in height as measured along a line from the top end to the bottom end of the roofing substrate. However, in some embodiments, the strip of material is no more than about 8 cm in height, or even no more than about 5 cm in height as measured along a line from the top end to the bottom end of the roofing substrate.

Photovoltaic elements suitable for use in the various aspects of the present invention include one or more interconnected photovoltaic cells provided together, for example, in a single package. The photovoltaic cells of the photovoltaic elements can be based on any desirable photovoltaic material system, such as monocrystalline silicon; polycrystalline silicon; amorphous silicon; III-V materials such as indium gallium nitride; II-VI materials such as cadmium telluride; and more complex chalcogenides (group VI) and pnicogenides (group V) such as copper indium diselenide and copper indium gallium selenide. For example, one type of suitable photovoltaic cell includes an n-type silicon layer (doped with an electron donor such as phosphorus) oriented toward incident solar radiation on top of a p-type silicon layer (doped with an electron acceptor, such as boron), sandwiched between a pair of electrically-conductive electrode layers. Another type of suitable photovoltaic cell is an indium phosphide-based thermo-photovoltaic cell, which has high energy conversion efficiency in the near-infrared region of the solar spectrum. Thin film photovoltaic materials and flexible photovoltaic materials can be used in the construction of photovoltaic elements for use in the present invention. In one embodiment of the invention, the photovoltaic element includes a monocrystalline silicon photovoltaic cell or a polycrystalline silicon photovoltaic cell. The photovoltaic elements for use in the present invention can be flexible, or alternatively can be rigid. In certain embodiments, the photovoltaic element is relatively rigid. In other embodiments, it is flexible.

The photovoltaic elements can be encapsulated photovoltaic elements, in which photovoltaic cells are encapsulated between various layers of material (e.g., as a laminate). For example, a photovoltaic laminate can include a top laminate layer at its top surface, and a bottom laminate layer at its bottom surface. The top laminate layer material can, for example, provide environmental protection to the underlying photovoltaic cells, and any other underlying layers. Examples of suitable materials for the top layer material include fluoropolymers, for example ETFE ("TEFZEL", or NORTON ETFE), PFE, FEP, PVF ("TEDLAR"), PCTFE or PVDF. The top laminate layer material can alternatively be, for example, a glass sheet, or a non-fluorinated polymeric material (e.g., polypropylene or acrylic). The bottom laminate layer material can be, for example, a fluoropolymer, for example ETFE ("TEFZEL", or NORTON ETFE), PFE, FEP, PVDF or PVF ("TEDLAR"). The bottom laminate layer material can alternatively be, for example, a polymeric material (e.g., polyolefin such as polypropylene, polyester such as PET); or a metallic material (e.g., steel or aluminum sheet).

Figure 4:
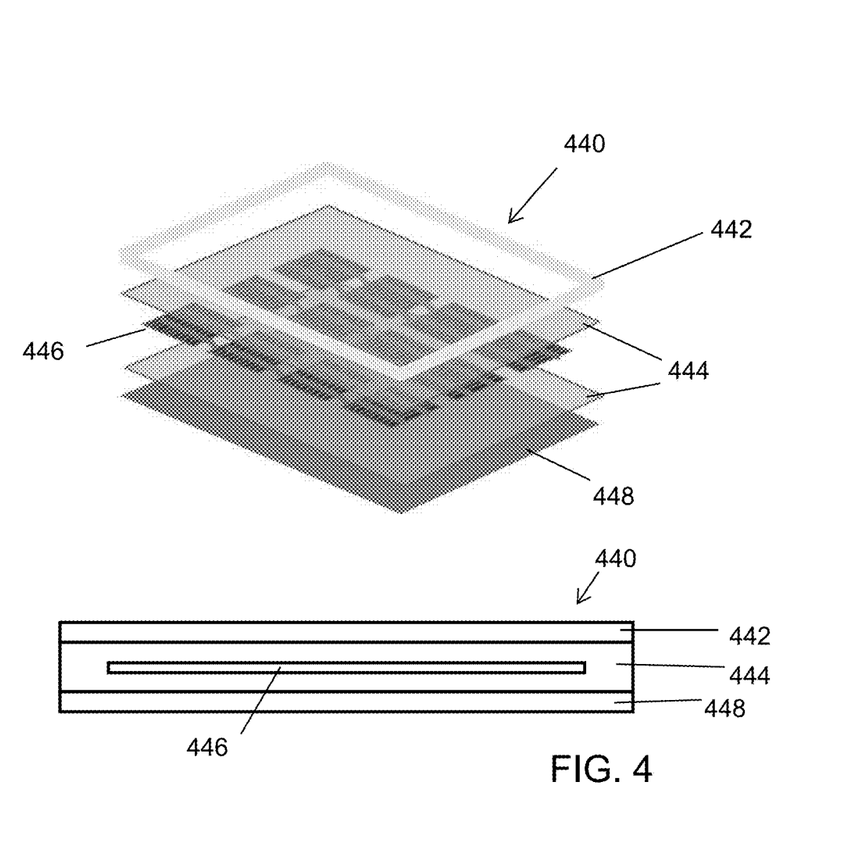
FIG. 4 provides an exploded perspective and a schematic cross-sectional view of a photovoltaic element suitable for use in one aspect of the invention.

As the person of skill in the art will appreciate, a photovoltaic laminate can include other layers interspersed between the top laminate layer and the bottom laminate layer. For example, a photovoltaic laminate can include structural elements (e.g., a reinforcing layer of glass, metal, glass or polymer fibers, a rigid film, or a flexible film); adhesive layers (e.g., EVA to adhere other layers together); mounting structures (e.g., clips, holes, or tabs); one or more electrical components (e.g., electrodes, electrical connectors; optionally connectorized electrical wires or cables) for electrically interconnecting the photovoltaic cell(s) of the encapsulated photovoltaic element with an electrical system. As described in more detail below, the return electrical path, any series interconnections between photovoltaic elements, and any bypass diodes can be included within the laminate. An example of a photovoltaic laminate suitable for use in the present invention is shown in schematic exploded view FIG. 4. Encapsulated photovoltaic element 440 includes a top protective layer 442 (e.g., glass or a fluoropolymer film such as ETFE, PVDF, PVF, FEP, PFA or PCTFE); encapsulant layers 444 (e.g., EVA, functionalized EVA, crosslinked EVA, silicone, thermoplastic polyurethane, maleic acid-modified polyolefin, ionomer, or ethylene/(meth)acrylic acid copolymer); a layer of electrically-interconnected photovoltaic cells 446 (which can include the return electrical path and bypass diode as described above); and a backing layer 448 (e.g., PVDF, PVF, PET).

The photovoltaic element can include at least one antireflection coating, for example as the top layer material in an encapsulated photovoltaic element, or disposed between the top layer material and the photovoltaic cells. The photovoltaic element can also be made colored, textured, or patterned, for example by using colored, textured or patterned layers in the construction of the photovoltaic element. Methods for adjusting the appearance of photovoltaic elements are described, for example, in U.S. Patent Application Publications nos. 2008/0006323, 2008/0271773, 2009/0000221, 2009/0133738 and 2009/0133739 and 2010/0282318, each of which is hereby incorporated herein by reference.

Suitable photovoltaic elements can be obtained, for example, from China Electric Equipment Group of Nanjing, China, as well as from several domestic suppliers such as Uni-Solar Ovonic, Sharp, Shell Solar, BP Solar, USFC, First-Solar, Ascent Solar, General Electric, Schott Solar, Evergreen Solar and Global Solar. Moreover, the person of skill in the art can fabricate photovoltaic laminates using techniques such as lamination or autoclave processes. Photovoltaic laminates can be made, for example, using methods disclosed in U.S. Pat. No. 5,273,608, which is hereby incorporated herein by reference. Flexible photovoltaic elements are commercially available from Uni-Solar as L-cells having a dimension of approximately 9.5"×14", S-cells having dimensions of approximately 4.75"×14", and T-cells having dimensions of approximately 4.75"×7". Photovoltaic laminates of custom sizes can also be made.

The photovoltaic element also has an operating wavelength range. Solar radiation includes light of wavelengths spanning the near UV, the visible, and the near infrared spectra. As used herein, the term "solar radiation," when used without further elaboration means radiation in the wavelength range of 300 nm to 2500 nm, inclusive. Different photovoltaic elements have different power generation efficiencies with respect to different parts of the solar spectrum. Amorphous doped silicon is most efficient at visible wavelengths, and polycrystalline doped silicon and monocrystalline doped silicon are most efficient at near-infrared wavelengths. As used herein, the operating wavelength range of a photovoltaic element is the wavelength range over which the relative spectral response is at least 10% of the maximal spectral response. According to certain embodiments of the invention, the operating wavelength range of the photovoltaic element falls within the range of about 300 nm to about 2000 nm. In certain embodiments of the invention, the operating wavelength range of the photovoltaic element falls within the range of about 300 nm to about 1200 nm.

The person of skill in the art will select bypass diode characteristics depending on a number of factors. The characteristics of the diode will depend, for example, on the type and size of photovoltaic element used, the intensity and variability of sunlight expected at the installation location, and the resistance at which a shaded photovoltaic element causes unacceptable system inefficiency. For example, the bypass diode can be configured to bypass a photovoltaic element when its output drops below about 30% of its maximum (i.e., in full sunlight at noon on the solstice) output (i.e., a about 30% or greater degradation in photovoltaically-generated current), below about 50% of its maximum output, below about 70% of its maximum output, below about 90% of its maximum output, or even below about 95% of its maximum output. For example, in one embodiment, in a 20 cell series-connected array of 1 volt/5 amp producing photovoltaic elements, the bypass diodes can be selected to bypass the photovoltaic elements when the output current drops below 4.75 amps (i.e., below 95% of the maximum output). Of course, as the person of skill will appreciate, each system design will have its own set of parameters; with higher amperage systems, relatively more degradation of current can be tolerated. In certain embodiments, the bypass diode can be an 8 amp bypass diode, available from Northern Arizona Wind & Sun, Flagstaff, Ariz.

In other embodiments, the bypass diode can be configured to bypass a photovoltaic element when its resistivity increases by at least about 400% of its resistivity at maximum output, at least about 300% of its resistivity at maximum output, at least about 100% of its resistivity at maximum output, at least about 50% of its resistivity at maximum output, at least about 25% of its resistivity at its maximum output, or even at least about 5% of its resistivity at maximum output.

The present invention can be practiced using any of a number of types of roofing substrates. The manufacture of photovoltaic roofing elements using a variety of roofing substrates are described, for example, in U.S. Patent Application Publications nos. 2007/0266562, 2009/0000222, 2009/0133340, 2009/0133740, 2009/0178350 and 2009/0159118, each of which is hereby incorporated herein by reference in its entirety. Roofing substrates can be formed, for example, in typical roofing industry dimensions, such as 18" (i.e., top to bottom)×36" (i.e., lateral dimension); 12"×36"; 12.25"×36"; 12"×37"; 18"×38", or 17"×40". In certain embodiments, these measurements are of the upward-facing zone (and therefore are the approximate dimensions of the photovoltaic roofing element as installed). When the roofing substrate is flexible, it can be provided as a continuous length of material, for example with a top-to-bottom dimension of 18", 17" or 12".

Figure 5:
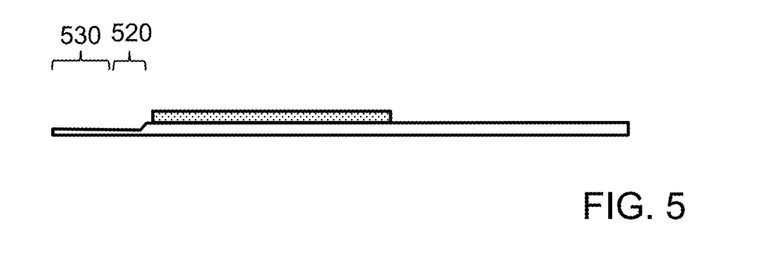
FIG. 5 is a schematic cross sectional view of a photovoltaic roofing element according to one embodiment of the invention.
Figure 6:
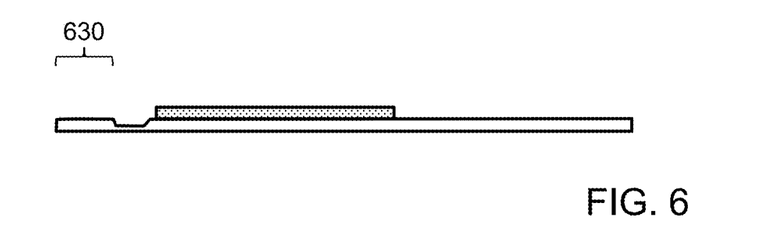
FIG. 6 is a schematic cross sectional view of a photovoltaic roofing element according to another embodiment of the invention.

In certain embodiments, the roofing substrate is flexible in the upward-facing zone. For example, the roofing substrate can be formed from roofing membrane material. In other embodiments, the roofing substrate is formed from one or more bottom layers of a photovoltaic laminate as described above. The roofing substrate can alternatively be some other sheet of flexible waterproof material, such as a polymer or a bituminous material. Flexible materials such as elastomeric membrane, polyvinylchloride membrane, thermoplastic polyolefin membrane or other flexible polymeric materials may be used. When the roofing substrate is sufficiently flexible, the flexible zone can be formed as a continuation of the material of the upward facing zone. Moreover, as shown in FIGS. 2 and 3, the strip of material at the bottom end of the flexible zone can be formed as a continuation of the material of the flexible zone, such that the installer can bend the substrate at an appropriate place to form the bent-over flexible zone. In the embodiment of FIGS. 2 and 3, the flexible zone, the upward-facing zone and the strip of material are all formed from the same continuous piece of material; the zones are defined by the bending of the flexible zone when installed. In other embodiments, and as shown in schematic cross-sectional view in FIG. 5, the flexible zone 520 is formed as a thinned region of material of the roofing substrate. This configuration can be especially useful when the flexible roofing substrate is not flexible enough to bend with the desired radius of curvature. The strip of material at the bottom end of the flexible zone can be formed as a continuation of the thinned material of the flexible zone, as shown by reference number 530 in FIG. 5, or can be of a different thickness, for example, of the thickness of the upward facing zone of the roofing substrate, as shown by reference number 630 in the cross-sectional schematic view of FIG. 6.

In certain embodiments, the roofing substrate is flexible (e.g., formed from a thin sheet of flexible roofing material, such as a roofing membrane material like TPO or vinyl), and the photovoltaic element is rigid. Rigid photovoltaic elements can conventionally be difficult to integrate with flexible roofing materials, as the flexible roofing material cannot protect the rigid photovoltaic element from stresses caused by blowing wind. In certain aspects, the present invention solves this problem by attaching the flexible roofing substrate to the roof at both its up-roof and down-roof ends, such blowing wind cannot lift it away from the roof. In such embodiments, a separate tack-down strip may not be necessary, and may be omitted. Moreover, use of a flexible roofing substrate can improve the adhesion of the photovoltaic element.

Figure 7:
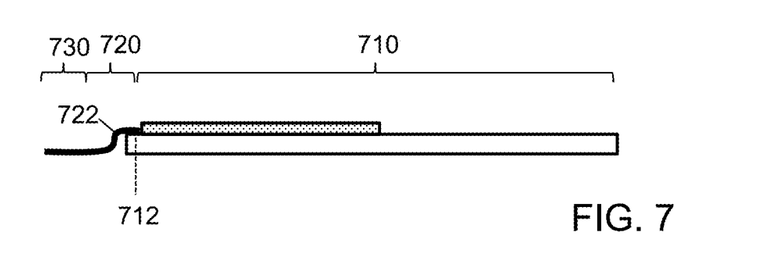
FIG. 7 is a schematic cross sectional view of a photovoltaic roofing element according to another embodiment of the invention.
Figure 8:
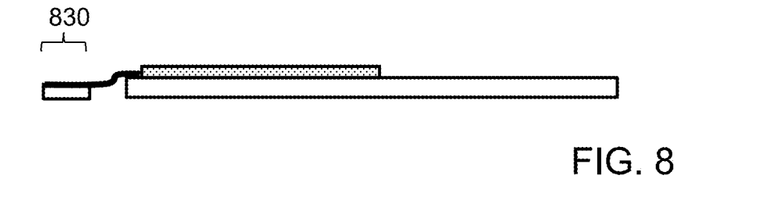
FIG. 8 is a schematic cross sectional view of a photovoltaic roofing element according to another embodiment of the invention.
Figure 9:
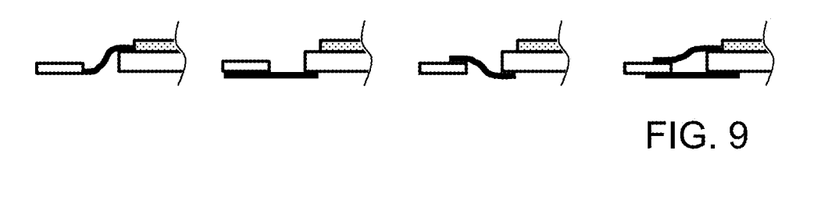
FIG. 9 is a schematic cross sectional view of a photovoltaic roofing element according to another embodiment of the invention.

In other embodiments, the roofing substrate is rigid in the upward-facing zone. For example, it can be formed as a tile, a shake, or a panel, from material such as polymer, metal (preferably coated), or ceramic. In certain such embodiments, the material of the roofing substrate is too rigid to be bent in the flexible zone (even when thinned), so a different material must be used for the flexible zone. Accordingly, in certain embodiments, the flexible zone is formed from one or more flexible materials different than the materials of the upward-facing zone. For example, in certain embodiments, the flexible zone of the roofing substrate and the strip of material disposed at the bottom end of the lateral flexible zone are formed from one or more materials different than the materials of the upward-facing zone. In one embodiment, as shown in schematic cross-sectional view in FIG. 7, the flexible zone 720 can be formed from a flexible material 722 attached at the bottom end 712 of the upward facing zone 710. The strip of material 730 can be formed as a continuation of the material of the flexible zone 720, as shown in FIG. 7, or can be formed from a separate material, as shown by reference no. 830 in the schematic cross-sectional view of FIG. 8. The material of the strip of material disposed at the bottom end of the lateral flexible zone can be, for example, rigid, or semi-rigid. In other embodiments, the material of the strip of material is flexible. A few additional configurations are shown in FIG. 9. The various materials can be attached to one another in any suitable manner, for example, with adhesive or sealant, using heat and/or pressure to seal polymer layers, and/or using fasteners.

In other embodiments, the roofing substrate is a semi-rigid roofing substrate. For example, the roofing substrate can be an asphalt shingle, a bituminous shingle or a plastic shingle that is not entirely rigid, but is nonetheless not easily bent to tight radii of curvature. For example, the roofing substrate can be a multilayer asphalt shingle. In certain such embodiments, the material of the roofing substrate is not sufficiently flexible to allow it to be bent with the desired radius of curvature. Accordingly, in certain embodiments, a separate flexible material can be used for the flexible zone as described above with reference to FIGS. 7-9. In such embodiments, the strip of material at the bottom end of the flexible zone can be formed as a continuation of the material of the flexible zone, as described above with reference to FIG. 7, or can be formed from some other material (e.g., the material of the upward-facing zone), as described above with reference to FIGS. 7 and 8. In other embodiments, the flexible zone can be formed as a thinned region of the material of the roofing substrate, as described above with reference to FIGS. 5 and 6.

Figure 10:
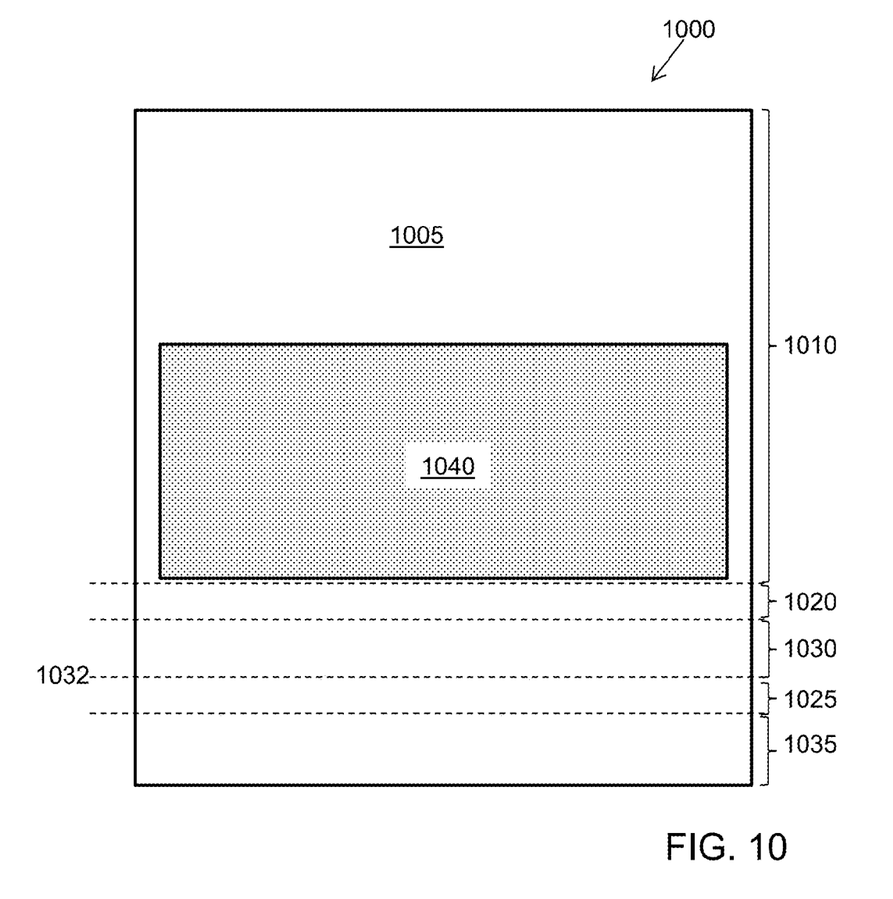
FIG. 10 is a plan schematic view of a photovoltaic roofing element according to another embodiment of the invention.

In another embodiment, the roofing substrate further includes a second flexible zone disposed at the bottom end of the strip of material disposed at the bottom end of the lateral flexible zone; and a strip of material disposed at the bottom end of the second flexible zone having a first surface on the same side of the substrate as the upward-facing surface and a height of at least about 1 cm as measured along a line from the top end to the bottom end of the roofing substrate. In such embodiments, the additional folded material (when installed) can provide an additional degree of protection from water ingress, and can allow for top-down application of photovoltaic roofing elements. In such embodiments, the flexible zone can be formed in two sections, with an additional strip of material therebetween. For example, as shown in FIG. 10, photovoltaic roofing element 1000 includes a roofing substrate 1005 including a photovoltaic element 1040 and an upwardly facing zone 1010 as described above with reference to FIG. 1. The roofing substrate 1005 also includes a flexible zone 1020 and a strip of material 1030 as described above with reference to FIG. 1. The roofing substrate further includes, disposed at the bottom end 1032 of the strip of material 1030, a second flexible zone 1025; and at the bottom end of the second flexible zone 1025, a second strip of material 1035. The flexible zones and strips of material can generally be as described above. For example, the flexible zones and strips of material can be formed from the same material as the upward-facing zone of the roofing substrate; or the flexible zones and/or strips of material can be formed from different materials, as described above.

Figure 11:
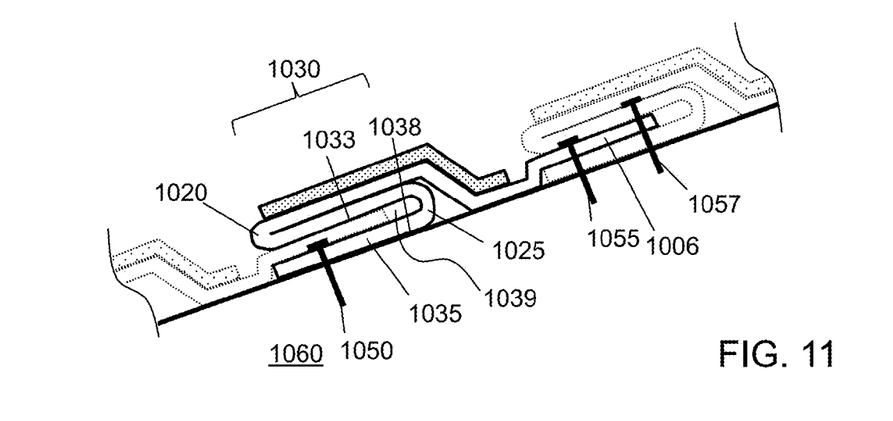
FIG. 11 is a schematic cross-sectional view of a photovoltaic roofing element of FIG. 10 installed on a roof deck.

A schematic cross-sectional view of the photovoltaic roofing element of FIG. 10 as installed on a roof deck is shown in FIG. 11. The person of skill in the art will appreciate that the aspect ratio is distorted in this figure to show the various layers in detail. Two additional photovoltaic roofing elements are shown in phantom view; as the person of skill in the art will appreciate, the photovoltaic roofing elements of the present invention can be disposed in rows or "courses" down the roof in an overlapping manner. Notably, the first surface 1033 of the strip of material 1030 is disposed facing downward (i.e., toward the roof deck 1060). The flexible zone 1020 is bent to fold the strip of material 1030 under the upward facing zone. The second flexible zone 1025 is bent to fold the second strip of material 1035 under the strip of material 1030. The second strip of material 1035 can be attached to the roof deck, for example, by a fastener 1050.

The strip of material 1030, the bent-over flexible zone 1025, and the second strip of material 1035 can cooperate to form a down-roof facing pleat 1039. In certain embodiments, the top end of a second photovoltaic element is disposed in the pleat, as shown by reference number 1006 in the pleat of the up-roof phantom photovoltaic roofing element. In such embodiments, a fastener 1055 can be used to attach the top end of the second photovoltaic roofing element to the roof deck along with the second strip of material. The fastener can also be used to attach the strip of material, the top end of the second photovoltaic element and the second strip of material to the roof deck, as shown by fastener 1057.

Figure 12:
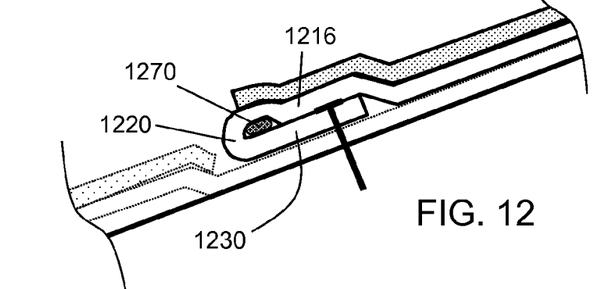
FIG. 12 is a schematic cross-sectional view of a photovoltaic roofing element according to another embodiment of the invention installed on a roof deck.

In another embodiment of the photovoltaic roofing elements disposed herein, wiring is disposed in the folded region between the strip of material, the lateral flexible zone, and the bottom end of the upward-facing zone. An example of such an embodiment is shown in schematic cross-sectional view in FIG. 12. In the embodiment of FIG. 12, wiring 1270 is disposed in the folded region between the strip of material 1230, the lateral flexible zone 1220 and the bottom end 1216 of the upward facing zone. Accordingly, laterally-extending wires can be hidden from view and protected from moisture by the folded-over roofing substrate. In certain embodiments, the roofing substrate has recesses formed therein, in which the wiring and/or an electrical connector associated therewith is disposed. Examples of roofing elements with recesses formed therein are described, for example, in U.S. Patent Application Publications no. 2010/0146878 and 2011/0048507, each of which is hereby incorporated by reference in its entirety. In certain embodiments, the roofing substrate has formed therein a recess shaped to at least partially receive the electrical connector. The recess can be formed, for example, in an upward- or downward-facing surface of the roofing substrate (e.g., in the upward-facing surface of the strip of material, and/or in the downward-facing surface of the bottom end of the upward-facing zone), or along a side of the photovoltaic roofing element (e.g., as a "notch" or a "cutout"). In certain embodiments of the invention, the recess can be disposed to retain the wiring and/or electrical connector so that a bump or surface irregularity that may otherwise telegraph through to the upward-facing surface is avoided. Wiring can also be laminated to the downward-facing surface of the roofing substrate, to provide a defined path for electrical interconnections.

Sealants and adhesives can also be used to provide additional weather resistance. For example, in certain embodiments, a sealant or adhesive on the first surface of the strip of material can also be used to seal the roofing substrate to the roof deck, especially in low-slope applications, or for use in severe environmental conditions. Sealants and adhesives can also be used to seal any fasteners, for example, at the level of the fastener, below the fastener, or over the fastener. Sealants and adhesives can be applied to seal overlying folds of material to one another, e.g., the strip of material to the underlying second strip of material; the strip of material to the overlying bottom end of the upward-facing zone. Sealants and adhesives can also be used to seal adjacent photovoltaic roofing elements to one another, for example, by sealing the top end of a second photovoltaic element to the strip of material and/or a second strip of material. The sealants and adhesives can be provided, for example, as strips pre-formed on the roofing substrates, and can be covered by release paper or film for exposure and adhesion in the field. Heat welding can also be used to seal roofing substrates to one another, for example, to provide a continuous roof covering.

Another aspect of the invention is a photovoltaic system including a plurality of photovoltaic roofing elements as described above, electrically interconnected. The photovoltaic system (e.g., a photovoltaic roofing system) can be interconnected with one or more inverters to allow photovoltaically-generated electrical power to be used on-site, stored in a battery, or introduced to an electrical grid. For example, a single inverter can be used to collect the photovoltaically-generated power and prepare it for further use. In other embodiments, the photovoltaic roofing elements can be interconnected with a plurality of micro-inverters disposed on the roof. For example, a single micro-inverter can be used for each photovoltaic element or photovoltaic roofing element; or a single micro-inverter can be used for a group of photovoltaic elements or photovoltaic roofing elements.

There can be one or more layers of material (e.g. underlayment), between the roof deck and the photovoltaic laminates/roofing elements. The roof can also include one or more standard roofing elements, for example to provide weather protection at the edges of the roof, or in areas not suitable for photovoltaic power generation. In some embodiments, non-photovoltaically-active roofing elements are complementary in appearance or visual aesthetic to the photovoltaic roofing elements.

Any cabling interconnecting the photovoltaic roofing elements of the invention in a photovoltaic roofing system can, for example, be long and flexible enough to account for natural movement of a roof deck, for example due to heat, moisture and/or natural expansion/contraction.

It will be understood that power generated by the photovoltaic roofing systems described herein may be used to power the building itself or may be directed elsewhere on an electrical grid, as desired. Electrical systems for handling the photovoltaically-generated power are described, for example, in U.S. Patent Application Publication no. 2008/0271774, which is hereby incorporated herein by reference in its entirety. Photovoltaic elements suitable for use in the present invention are described in, for example, in U.S. Patent Application Publication no. 2009/0133340, which is hereby incorporated herein by reference in its entirety.

The photovoltaic roofing system may be installed adjacent to conventional roofing materials, such as asphalt shingles. In such cases, it may be desirable to design the photovoltaic roofing elements so that their exposure height is substantially the same as that of the adjacent roofing materials (e.g., 5", 5⅝", 7", 8").

Photovoltaic roofing elements as described herein can be installed with conventional roofing materials disposed down-roof from them. In such embodiments, the photovoltaic roofing elements can overlap the conventional roofing materials, as is conventional in the roofing arts. If no conventional roofing materials are to be disposed down-roof from the photovoltaic roofing elements, a starter accessory (e.g., flashing) can be used to integrate the down-roof most photovoltaic roofing elements to the roof deck.

In order to ease installation, the photovoltaic roofing elements of the present invention can include lines or other visible features (e.g., painted shapes, or notches or ridges physically formed in the photovoltaic roofing element) to demarcate the proper relative positioning of overlying or adjacent photovoltaic roofing elements. Such features can help to ensure the proper positioning during installation. Lines or other features can also serve as indicators for correct nail placement. This can be especially important when the photovoltaic roofing element has wiring disposed in a specified location underneath (e.g., by being laminated or adhered thereto, or disposed in a recess thereof).

Another aspect of the invention is a method for installing a photovoltaic roofing element as described herein on a roof deck. The method includes (e.g., first) attaching the first surface of the strip of material to the roof deck, with the first surface facing downward; then folding the lateral flexible zone such that the upward facing zone is facing upward; and attaching the upward facing zone to the roof deck. In certain embodiments, the method further includes (e.g., before attaching the upward facing zone to the roof deck) disposing wiring in the folded region between the strip of material, the flexible zone, and the bottom end of the upward-facing zone.

Another aspect of the invention is a method for installing a photovoltaic roofing element as described herein with reference to FIGS. 10 and 11 on a roof deck. The method includes (e.g., first) attaching the second strip of material to the roof deck such that the first surface faces upward; then folding the second flexible zone such that the strip of material is folded over the second strip of material, with its first surface facing downward; then folding the lateral flexible zone such that the upward facing zone is facing upward; and attaching the upward facing zone to the roof deck. The method can further include disposing the top end of a second photovoltaic element on top of the second strip of material, so that when installation is complete, it is disposed in the pleat formed by the second strip of material, the second flexible zone, and the strip of material. This step can be performed at any point in the process. For example, if the top end of the second photovoltaic element is disposed on the second strip of material before it is attached to the roof, the same fasteners can fasten both to the roof. Alternatively, the second strip of material can be fastened to the roof, then the top end of the second photovoltaic element can be disposed on the second strip of material at a later point (e.g., before the folding of the second flexible zone, or even after).

The methods described herein can further include the electrical interconnection of the photovoltaic roofing elements. The disposal on the roof and electrical interconnections can be performed in any desirable order. In certain embodiments, the photovoltaic roofing elements themselves can be assembled on the roof, for example in conjunction with electrically interconnecting them, as described above with reference to U.S. Patent Application Publication no. 2009/0159118, the entirety of each of which is incorporated herein by reference.

In one embodiment the photovoltaic roofing elements are pre-assembled in a manufacturing environment. In other embodiments, the photovoltaic roofing elements are assembled in the field. For example, the photovoltaic roofing elements can be provided to the installer in two parts, the roofing substrate and the photovoltaic element, and the photovoltaic element can be attached at any convenient point in the process. Self-adhesive photovoltaic elements can be used, for example, with roofing substrates having receptor zones, for example, as described in U.S. Patent Application Publications nos. 2009/0159118, 2009/0178350, 2011/0017278 and 2011/0030761, each of which is hereby incorporated herein by reference in its entirety. The photovoltaic elements can be affixed to the roofing substrate in a number of fashions, including adhesives such as roll adhesives, epoxies, or sprays, provided in continuous or discontinuous forms. Fasteners can also or alternatively be used to affix the photovoltaic elements to the roofing substrate. Adhesion of photovoltaic elements to roofing substrates is described in more detail in U.S. Patent Application Publication no. 2009/0133340, which is hereby incorporated herein by reference in its entirety.

Another aspect of the invention is a roof comprising a roof deck and a photovoltaic roofing system as described herein disposed on the roof deck. The photovoltaic roofing elements described herein can be utilized with many different building structures, including residential, commercial and industrial building structures.

Another aspect of the invention is a kit for the installation of a photovoltaic roofing system, the kit comprising a plurality of photovoltaic roofing elements as described herein.

Another aspect of the invention is a kit for the installation of a photovoltaic roofing system, the kit comprising a plurality of roofing substrates as described herein and a number of photovoltaic elements as described herein, photovoltaic elements being adapted to be attachable to the roofing substrates to form photovoltaic roofing elements as described herein. The roofing substrate can optionally be provided as larger pieces of material (e.g., in roll form), and can be cut to the desired size at the site.

Figure 13:
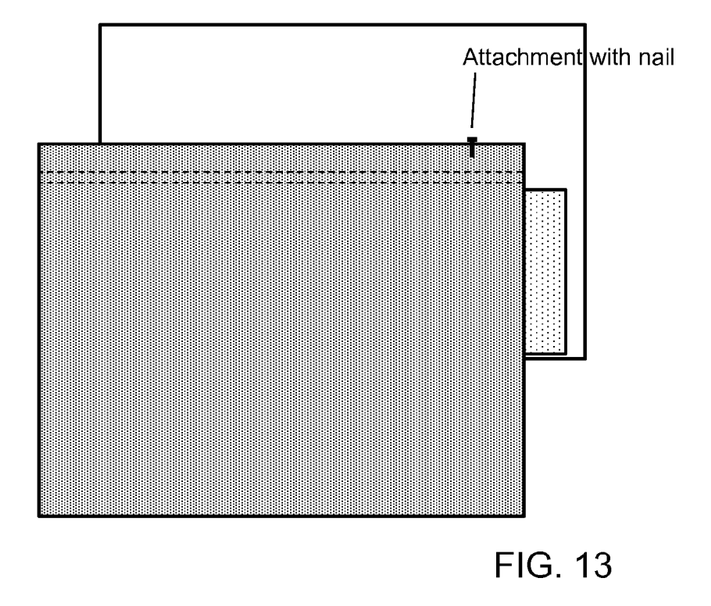
FIG. 13 is a schematic plan view of an initial step in an example of the installation of photovoltaic roofing elements according to one embodiment of the invention.
Figure 14:
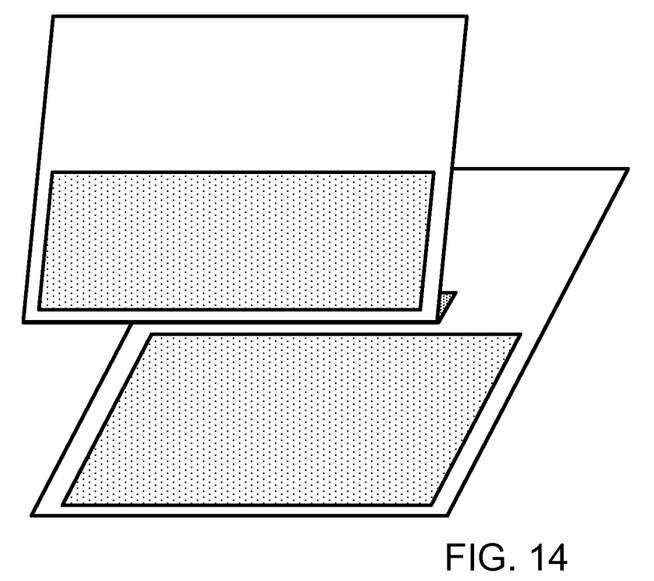
FIG. 14 is a schematic perspective view of an intermediate step in the example of the installation of photovoltaic roofing elements.
Figure 15:
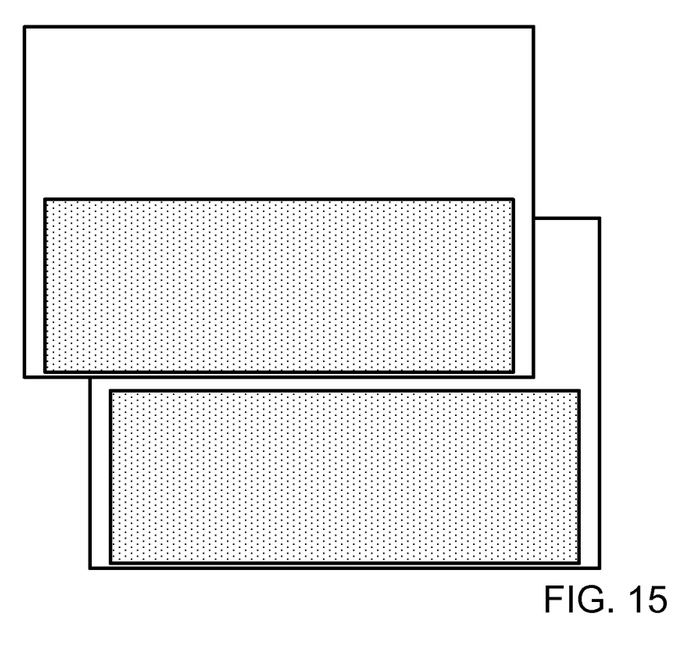
FIG. 15 is a schematic plan view of a final step in the example of the installation of the photovoltaic roofing elements.
Figure 16:
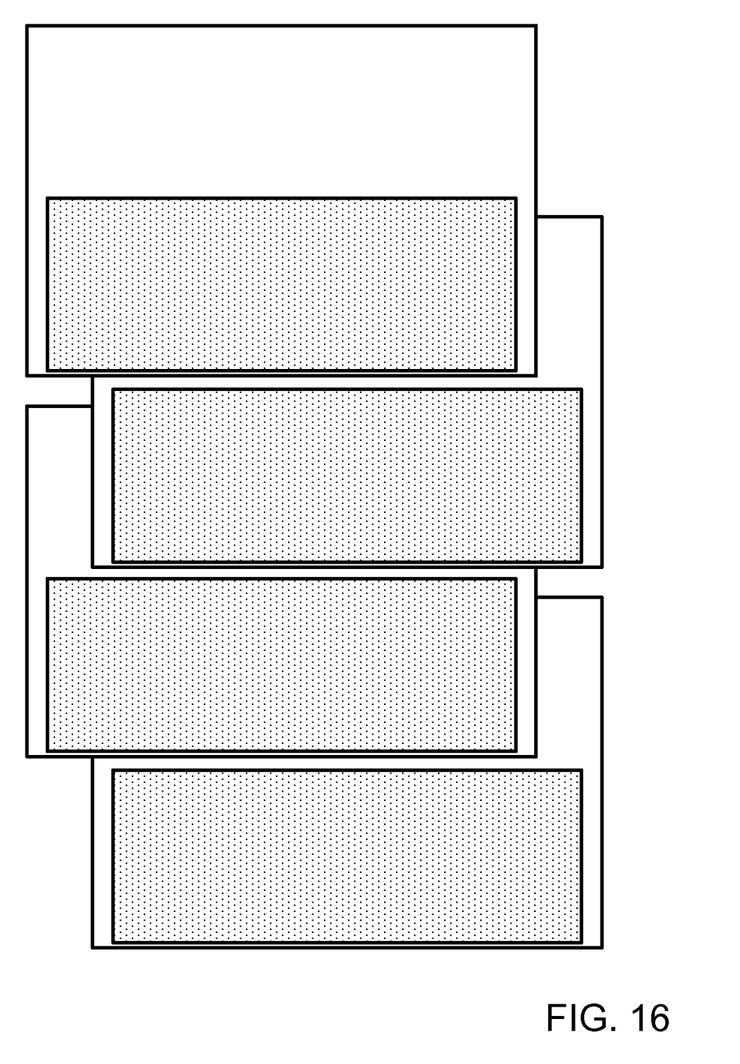
FIG. 16 is a schematic plan view of a racked array of photovoltaic roofing elements according to one embodiment of the invention.

An example of the installation of photovoltaic roofing elements according to one embodiment of the invention is depicted in FIGS. 13-15. In certain embodiments, the roofing substrate is formed from roofing membrane, and the strip of material is formed from a thin strip of metal. In another embodiment, in which the strip of material is folded-over roofing membrane. FIG. 16 shows an array of four photovoltaic roofing elements, disposed in a racked configuration.

Further, the foregoing description of embodiments of the present invention has been presented for the purposes of illustration and description. It is not intended to be exhaustive or to limit the invention to the precise forms disclosed. As the person of skill in the art will recognize, many modifications and variations are possible in light of the above teaching. It will be apparent to those skilled in the art that various modifications and variations can be made to the present invention without departing from the scope of the invention. Thus, it is intended that the present invention cover the modifications and variations of this invention provided they come within the scope of the claims and their equivalents.

What is claimed is:

1. A photovoltaic roofing element disposed on a roof deck, the photovoltaic roofing element comprising
   a roofing substrate including a top end disposed toward the top end of the roof deck, and a bottom end disposed toward the bottom end of the roof deck, the roofing substrate including an upward-facing zone having an upward-facing surface, a downward-facing surface and a bottom end; a lateral flexible zone extending adjacent the bottom end of the upward-facing zone along the entire width of the upward facing zone, the lateral flexible zone having a bottom end; and a strip of material disposed at the bottom end of the lateral flexible zone along the entire width of the lateral flexible zone, the strip of material having a first surface on the same side of the roofing substrate as the upward-facing surface, a second surface opposite the first surface and a height of at least 2 cm as measured along a line from the top end to the bottom end of the roofing substrate,
      wherein the first surface of the strip of material is disposed facing downward, the upward-facing surface of the upward-facing zone of the roofing substrate is disposed facing upward, and the lateral flexible zone is bent to fold the strip of material under the upward-facing zone such that the second surface of the strip of material faces upward and is disposed in contact with the downward-facing surface of the upward-facing zone, and
      wherein the strip of material is attached to the roof deck and disposed on top of an underlying photovoltaic roofing element; and
   a photovoltaic element disposed on the upward-facing surface of the upward facing zone of the roofing substrate.

2. A photovoltaic roofing element according to claim 1, wherein the lateral flexible zone can be bent at least 120° without failure to a radius of curvature in the range of 0.1 mm to 3 cm.

3. A photovoltaic roofing element according to claim 1, wherein the strip of material disposed at the bottom end of the lateral flexible zone is at least 3 cm in height as measured along a line from the top end to the bottom end of the roofing substrate.

4. A photovoltaic roofing element according to claim 1, wherein the strip of material disposed at the bottom end of the lateral flexible zone is no more than 8 cm in height as measured along a line from the top end to the bottom end of the roofing substrate.

5. A photovoltaic roofing element according to claim 1, wherein the roofing substrate is semi-rigid in the upward-facing zone.

6. The photovoltaic roofing element according to claim 5, wherein the material of the upward-facing zone is not flexible enough to bend to 120° without failure to a radius of curvature in the range of 0.1 mm to 3 cm, and wherein the lateral flexible zone is formed as a thinned region of the material of the roofing substrate.

7. A photovoltaic roofing element according to claim 1, wherein the strip of material disposed at the bottom end of the lateral flexible zone is flexible.

8. A photovoltaic roofing element according to claim 1, wherein the strip of material at the bottom end of the lateral flexible zone is rigid or semi-rigid.

9. A photovoltaic roofing element according to claim 1, wherein the lateral flexible zone of the roofing substrate is formed from one or more flexible materials different than the materials of the upward-facing zone.

10. A photovoltaic roofing element according to claim 1, wherein the lateral flexible zone of the roofing substrate and the strip of material disposed at the bottom end of the lateral flexible zone are formed from one or more materials different than the materials of the upward-facing zone.

11. A photovoltaic roofing element according to claim 1, further comprising a second flexible zone disposed at the bottom end of the strip of material disposed at the bottom end of the lateral flexible zone; and a strip of material disposed at the bottom end of the second flexible zone having a first surface on the same side of the substrate as the upward-facing surface and a height of at least 1 cm as measured along a line from the top end to the bottom end of the roofing substrate, wherein the first surface of the second strip of material is disposed upward, and the second flexible zone is bent to fold the second strip of material under the strip of material, such that the second strip of material is disposed in contact with the downward-facing surface of the upward-facing zone.

12. The photovoltaic roofing element disposed on a roof according to claim 11, wherein the top end of the underlying photovoltaic roofing element is disposed in a down-roof facing pleat formed by the strip of material, the second flexible zone, and the second strip of material.

13. A method for installing a photovoltaic roofing element according to claim 11 on a roof deck, the method comprising
providing a photovoltaic roofing element comprising
a roofing substrate including a top end configured to be disposed toward the top end of the roof deck, and a bottom end configured to be disposed toward the bottom end of the roof deck, the roofing substrate including an upward-facing zone having an upward-facing surface, a downward-facing surface and a bottom end; a lateral flexible zone extending adjacent the bottom end of the upward-facing zone along the entire width of the upward facing zone, the lateral flexible zone having a bottom end; a strip of material disposed at the bottom end of the lateral flexible zone along the entire width of the lateral flexible zone, the strip of material having a first surface on the same side of the substrate as the upward-facing surface, a second surface opposite the first surface and a height of at least 2 cm as measured along a line from the top end to the bottom end of the roofing substrate; a second flexible zone disposed at the bottom end of the strip of material disposed at the bottom end of the lateral flexible zone; and a strip of material disposed at the bottom end of the second flexible zone having a first surface on the same side of the substrate as the upward-facing surface and a height of at least 1 cm as measured along a line from the top end to the bottom end of the roofing substrate; and
a photovoltaic element disposed on the upward-facing surface of the upward facing zone of the roofing substrate;
attaching the second strip of material to the roof deck such that the first surface faces upward; then
folding the second flexible zone such that the strip of material is folded over the second strip of material, with its first surface facing downward; then
folding the lateral flexible zone such that the upward facing zone is facing upward; and
attaching the upward facing zone to the roof deck to provide the photovoltaic roofing element of claim 1.

14. A photovoltaic roofing element disposed on a roof according to claim 1, wherein one or more fasteners are driven through the strip of material to attach it to the roof deck.

15. A photovoltaic roofing element disposed on a roof according to claim 1, wherein wiring is disposed between the second surface of the strip of material, the lateral flexible zone, and a downward-facing surface of the roofing substrate opposite the bottom end of the upward-facing zone.

16. A photovoltaic roofing system comprising a plurality of electrically-interconnected photovoltaic roofing elements according to claim 1, disposed on a roof deck.

17. A method for installing a photovoltaic roofing element on a roof deck according to claim 1, the method comprising
providing a photovoltaic roofing element comprising
a roofing substrate including a top end configured to be disposed toward the top end of the roof deck, and a bottom end configured to be disposed toward the bottom end of the roof deck, the roofing substrate including an upward-facing zone having an upward-facing surface, a downward-facing surface and a bottom end; a lateral flexible zone extending adjacent the bottom end of the upward-facing zone along the entire width of the upward facing zone, the lateral flexible zone having a bottom end; and a strip of material disposed at the bottom end of the lateral flexible zone along the entire width of the lateral flexible zone, the strip of material having a first surface on the same side of the substrate as the upward-facing surface, a second surface opposite the first surface and a height of at least 2 cm as measured along a line from the top end to the bottom end of the roofing substrate; and
a photovoltaic element disposed on the upward-facing surface of the upward facing zone of the roofing substrate;

attaching the first surface of the strip of material to the roof deck, on top of an underlying photovoltaic element, with the first surface facing downward and the second surface facing upward;

folding the lateral flexible zone such that the upward-facing zone of the roofing substrate is facing upward; and attaching the upward-facing zone of the roofing substrate to the roof deck to provide the photovoltaic roofing element of claim 1.

18. The method according to claim 17, further comprising disposing wiring between the second surface of the strip of material, the lateral flexible zone, and a downward-facing surface of the roofing substrate opposite the bottom end of the upward-facing zone.

19. The method according to claim 17, wherein the photovoltaic element is disposed on the upward-facing zone after the upward-facing zone is attached to the roof deck.

* * * * *